(12) United States Patent
Yanagida et al.

(10) Patent No.: US 9,144,166 B2
(45) Date of Patent: Sep. 22, 2015

(54) ELECTRONIC COMPONENT

(71) Applicant: TDK CORPORATION, Tokyo (JP)

(72) Inventors: Miyuki Yanagida, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 136 days.

(21) Appl. No.: 13/958,966

(22) Filed: Aug. 5, 2013

(65) Prior Publication Data

US 2014/0041930 A1    Feb. 13, 2014

(30) Foreign Application Priority Data

Aug. 9, 2012 (JP) .................................. 2012-176674

(51) Int. Cl.
| | | |
|---|---|---|
| *H01G 4/005* | (2006.01) | |
| *H05K 7/00* | (2006.01) | |
| *H01G 4/232* | (2006.01) | |

(52) U.S. Cl.
CPC . *H05K 7/00* (2013.01); *H01G 4/232* (2013.01)

(58) Field of Classification Search
USPC ........... 361/311–313, 303–305, 306.1–306.3, 361/321.1, 321.2
See application file for complete search history.

(56) References Cited

U.S. PATENT DOCUMENTS

2010/0038120 A1    2/2010    Kojima et al.

FOREIGN PATENT DOCUMENTS

| JP | 2004186052 | * | 2/2004 |
|---|---|---|---|
| JP | A-2004-186502 | | 7/2004 |
| JP | A-2010-45209 | | 2/2010 |

* cited by examiner

*Primary Examiner* — Nguyen T Ha
(74) *Attorney, Agent, or Firm* — Oliff PLC

(57) ABSTRACT

One aspect of an electronic component is an electronic component comprising an element body having a mounting surface and a plurality of side faces, the electronic component further comprising a first terminal electrode formed on the mounting surface and one of the plurality of side faces, a second terminal electrode formed on the mounting surface and another side face in the plurality of side faces, a metal film disposed on a surface of a mounting part of the first and second terminal electrodes formed on the mounting surface, and an oxide film covering at least a part of surfaces of side face parts of the first and second terminal electrodes formed on the side faces.

3 Claims, 7 Drawing Sheets

ELECTRONIC COMPONENT

BACKGROUND OF THE INVENTION

1. Field of the Invention

The present invention relates to an electronic component equipped with a terminal electrode.

2. Related Background Art

It has been required for electronic components to become further smaller in size as electronic devices to be mounted therewith have been attaining higher performances and smaller sizes. The electronic components thus made smaller in size have further been demanded to be mounted to printed wiring boards and the like at higher density with solder in a reflow step (a step of placing the electronic components on a board coated beforehand with a solder paste and collectively performing soldering in a continuous furnace), so as to be used in electronic devices and the like.

FIG. 1 is a schematic view of a cross section of a typical electronic component mounted on a printed wiring board 10. In this electronic component 1, inner electrode layers 3 are stacked alternately with ceramic layers 4 within an element main body 2 (hereinafter referred to as element body 2). Foundation electrode layers 5 of terminal electrodes 7 are formed so as to cover surfaces of the element body 2 where the inner electrode layers 3 are exposed. The foundation electrode layer 5 has an outer surface formed with a Ni plating layer 6a which, together with a Sn plating layer 6b formed thereon, constitutes a two-layered plating layer 6.

Further, the electronic component 1 is joined through solder 8 to pads 9 on the printed wiring board 10. Heat treatment in the reflow step causes the solder 8 to run the Sn plating layers 6b and wet the surfaces of the plating layers 6, so as to form an intermetallic compound with the Sn plating layers 6b, thereby joining with the pads 9 on the board.

On the other hand, as terminal electrodes of electronic components, those of LGA (Land Grid Array) type may be employed in order to be mounted on printed wiring boards and the like at high density with solder. FIG. 2 is a schematic view of a cross section of a typical electronic component employing the LGA for its terminal electrodes.

The electronic component 11 illustrated in FIG. 2 has a plurality of patterns of ceramic layers 13 and inner electrode layers 12 stacked alternately with each other with the inner electrode layers 12 shifting alternately to one side or the other and connecting with their corresponding through-hole electrodes 14 penetrating therethrough in the stacking direction at the shifted parts. Outer connection electrodes 15 are formed as terminal electrodes at respective end parts of the through-hole electrodes 14 and arranged so as to be connectable to a board or the like on one surface of the electronic component 11. Examples of such electronic component 11 equipped with LGA type terminal electrodes have been proposed in Patent Literature 1 (Japanese Patent Application Laid-Open No. 2010-045209) and the like.

In the electronic component 1, however, the terminal electrodes 7 are formed on the lower face of the element body 2 (the surface opposing the printed wiring board 10; hereinafter referred to as mounting surface) and side faces of the element body 2 adjacent to the mounting surface. At the time of soldering, the solder wets not only the surfaces of the mounting parts of the terminal electrodes 7 formed on the mounting surface of the element body 2, but also the side faces extending substantially perpendicularly to the mounting parts of the terminal electrodes 7, which makes it difficult for the mounting area to become smaller on the printed wiring board 10.

When electronic components have a very small distance therebetween, side face parts of the terminal electrodes 7 may come into contact with each other, thereby causing a short circuit, which puts a limit to reducing the mounting area.

In the electronic component 11, on the other hand, terminal electrode parts can be formed as the outer connection electrodes 15 on the lower face alone, which makes it easier to reduce the mounting area. However, it necessitates complicated steps of making through-holes, filling the through-holes with conductive pastes, and so forth at the time of forming the electronic component 11, which makes it hard to further thin the ceramic layers 13 and inner electrode layers 12 or increase the number thereof. The existence of the through-hole electrodes 14 makes the effective electrode area smaller than that of the conventional electronic component 1, thereby making it harder to produce an electronic component having a Large capacity. Hence, there has been a limit to reducing the mounting area, which has been advancing together with demands for making these electronic components smaller, whereby it has been required to reduce the mounting area without lowering the capacity of the electronic component.

SUMMARY OF THE INVENTION

In view of the foregoing circumstances, it is an object of the present invention to provide an electronic component equipped with a terminal electrode which can reduce its mounting area.

In one aspect, the present invention provides an electronic component comprising an element body having a mounting surface and a plurality of side faces, the electronic component further comprising a first terminal electrode formed on the mounting surface and one of the plurality of side faces, a second terminal electrode formed on the mounting surface and another side face in the plurality of side faces, a metal film disposed on a surface of a mounting part of the first and second terminal electrodes formed on the mounting surface, and an oxide film covering at least a part of a surface of a side face part of each of the first and second terminal electrodes formed on the side faces.

This can yield an electronic component equipped with terminal electrodes which can reduce their mounting area.

The oxide film may be mainly composed of an element different from a main component of the metal film.

This can further inhibit solder from going up the surfaces of side parts of the terminal electrodes in a reflow step, whereby an electronic component having terminal electrodes which can further reduce the mounting area can be obtained.

The metal film may contain Sn or a Sn alloy as a main component.

This can yield an electronic component which can favorably join with boards regardless of types of their pads.

The present invention can yield an electronic component with a small mounting area.

DESCRIPTION OF THE PREFERRED EMBODIMENTS

Figure 1:
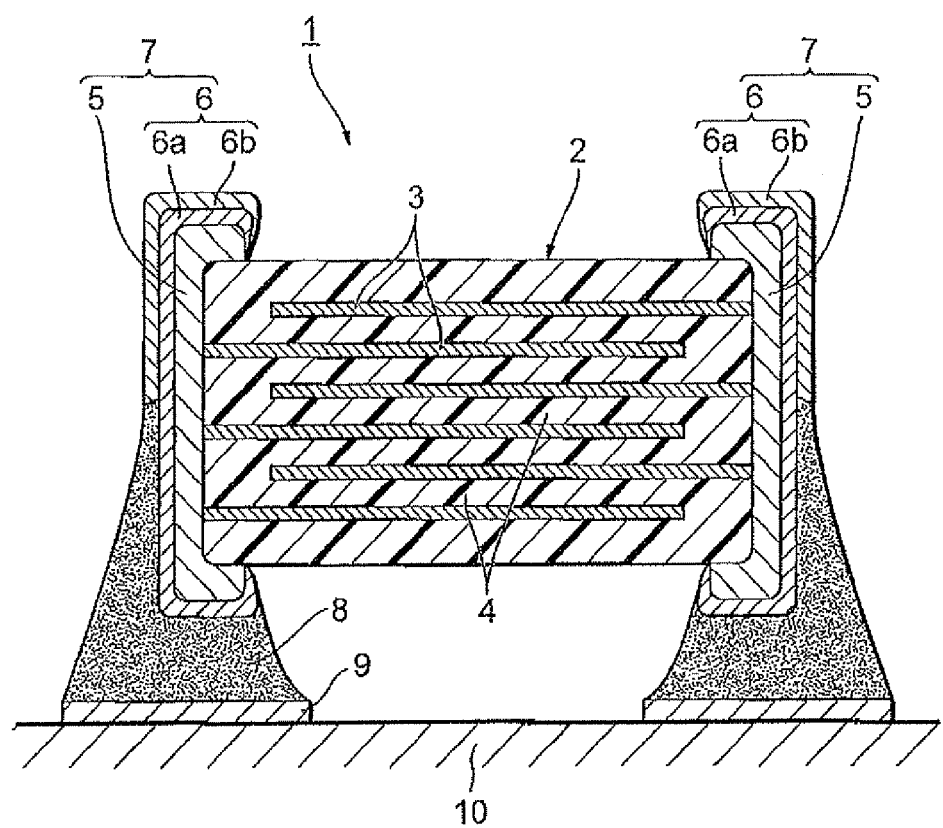
FIG. 1 is a sectional view schematically illustrating a mode of mounting a conventional electronic component.
Figure 2:
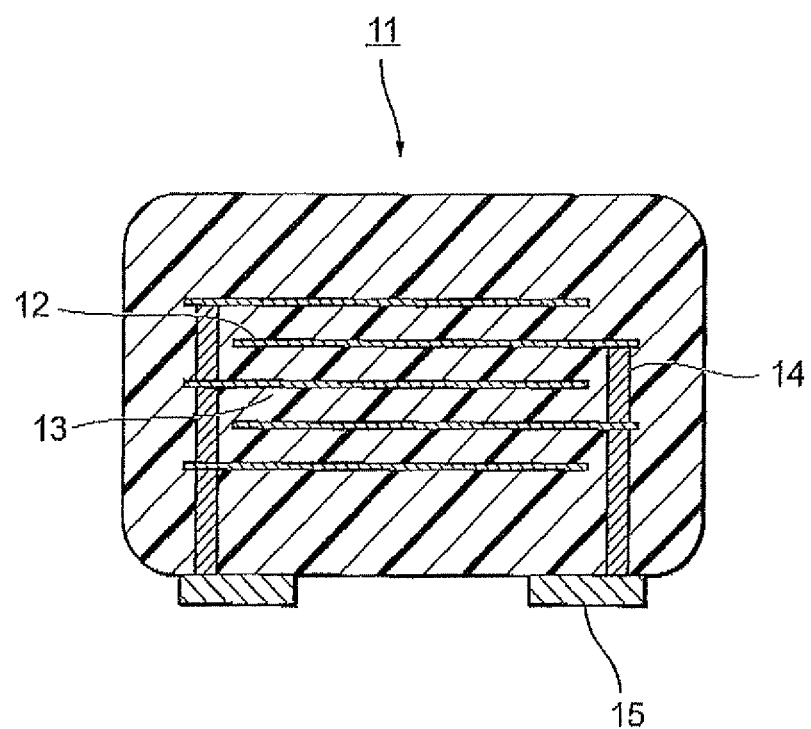
FIG. 2 is a sectional view schematically illustrating a conventional through-hole type electronic component.

Though not restricted in particular, examples of the electronic component in accordance with embodiments of the present invention include capacitors, piezoelectric elements, inductors, varistors, thermistors, resistors, transistors, diodes, crystal oscillators, their composite elements, and other surface-mounting electronic components.

In the following, preferred embodiments of the present invention will be explained with reference to the drawings when necessary. In the drawings, the same or equivalent constituents will be referred to with the same signs while omitting their overlapping descriptions. Positional relationships such as upper, lower, left, and right will be based on those in the drawings unless otherwise noted.

Figure 3:
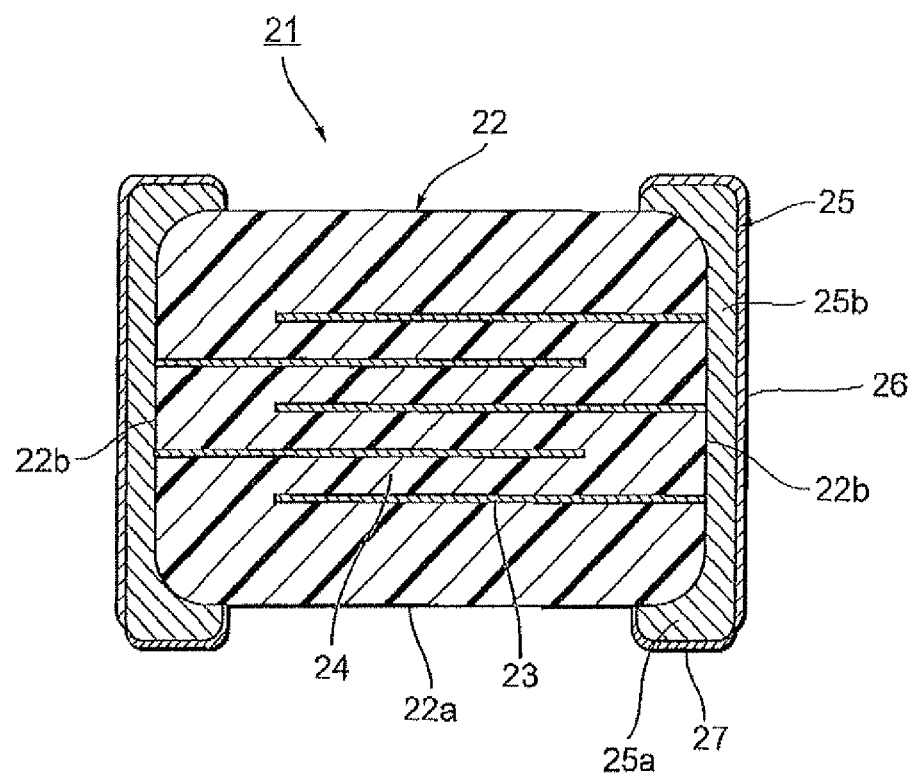
FIG. 3 is a sectional view schematically illustrating an electronic component of Embodiment 1.

Embodiment 1 explains an electronic component 21 illustrated in. FIG. 3 by way of example. As illustrated in FIG. 3, the electronic component 21 comprises an element body 22 in which ceramic layers 24 are stacked alternately with inner electrode layers 23. The element body 22 has a mounting surface 22a, which is a surface opposing an undepicted board circuit, and four side faces 22b, 22c (Regarding 22c, refer to FIG. 4 described hereinafter) The inner electrode layers 23 are stacked such that their end parts are alternately exposed to a pair of opposing side faces 22b of the element body 22. Both end parts of the element body 22 including the pair of side faces 22b are formed with a pair of terminal electrodes 25 electrically connected to their corresponding inner electrode layers 23 alternately arranged within the element body 22. The pair of terminal electrodes 25 are formed so as to cover both end parts of the element body 22 and connected to the exposed parts of the inner electrode layers 23, so as to constitute an electric circuit. That is, the electronic component 21 comprises a first terminal electrode 25 formed on the mounting surface of the element body 2 and one of a plurality of side faces (i.e., four side faces), a second terminal electrode 25 formed on the mounting surface of the element body 2 and another side face in the plurality of side faces, and metal layers 27 formed on the mounting surface of the element body 22 in the parts of the first and second terminal electrodes. When appropriate in the following explanation, in the terminal electrodes 25, the parts formed on the mounting surface 22a of the element body 22 will be referred to as mounting parts 25a, while parts formed on the side faces 22b, 22c of the element body 22 will be referred to as side face parts 25b. By the side faces of the terminal electrodes 25 are meant surfaces of side face parts located substantially perpendicularly to the mounting parts of the terminal electrodes 25.

The side faces of the terminal electrodes 25 formed on an element body having no inner electrode layers are the surfaces of the side face parts 25b extending substantially perpendicularly to the surface of the mounting part 25a of the terminal electrode 25, while other opposing surfaces also have side faces of another terminal electrode 25.

In the electronic component 21 in accordance with Embodiment 1, each terminal electrode 25 has an oxide film 26 and a metal film 27 on its surface. More specifically, only the surface of the mounting part 25a of the terminal electrode 25 of the electronic component 21 is covered with the metal layer 27, while the surface of the part (surface of the side part 25b) excluding the part covered with the metal layer 27 in the terminal electrode 25 is totally covered with the oxide film 26.

In the electronic component 21 in accordance with Embodiment 1, the element body 22, whose outer shape and size can be set according to its use without being restricted in particular, may typically have a substantially rectangular parallelepiped outer shape with a size on the order of 0.2 to 5.6 mm (L)×0.1 to 5.0 mm (W)×0.1 to 1.9 mm (H). In particular, a small size of 0.4 min or less (L)>+0.2 mm or less (W)×0.2 mm or less (H) can also be effective in reducing inferior joints at the time of mounting to the board with solder and so forth.

The thickness of the terminal electrode 25 in accordance with Embodiment 1 may be determined as appropriate according to its use and the like and is preferably on the order of 1 to 50 μm in general.

From the viewpoint of inhibiting solder from going up at the time of mounting the electronic component 21 to the board by soldering, it will be sufficient if the oxide films 26 are disposed at least on the surfaces of the side face parts 25b of the terminal electrodes 25 opposing each other longitudinally of the electronic component 21. In other words, the oxide films 26 are disposed on the surfaces of the side face parts 25b, which are at least a pair of planes located perpendicularly to the surfaces of the mounting parts 25a in the terminal electrodes 25 of the electronic component 21 and distanced farthest from each other. This is because they inhibit solder from rising along the surfaces of the side face parts of the terminal electrodes 25 at the time of mounting by soldering and thus are effective in reducing the mounting area. The oxide films 26 cover the surfaces of the side face parts 25b of the terminal electrodes 25 and thus can inhibit the side face parts of the terminal electrodes 25 from coming into contact with each other and causing a short circuit even when the distance between the electronic components is very short.

Preferably, the oxide film 26 covers the surface of the part of the terminal electrode 25 excluding the part covered with the metal layer 27, i.e., it covers the surface of the side face part 25b of the terminal electrode 25. This prevents solder from wetting the surfaces of the terminal electrode 25 other than the surface of the mounting part and rising therefrom at the time of mounting the electronic component 21 to the board, whereby the mounting area can be reduced. The oxide film 26 also renders the terminal electrode 25 more favorable, since it is effective in restraining deterioration such as corrosion from occurring under environments in use.

The metal layers 27 of the terminal electrodes 25 are disposed on a plane parallel to the inner electrode layers 23 in Embodiment 1, but may be on any mounting surface of the electronic component 21, i.e., any surface opposing the board circuit to be connected to the electronic component 21 when mounting the electronic component 21 to the board circuit, without being influenced by the arrangement of the inner electrode layers 23 of the element body 22.

Joining the electronic component 21 to the board through the metal layers 27 and solder can yield a board-mounted component having a small mounting area. Therefore, in order to make it easier to grasp the surface provided with the metal layers 27, it is preferred for the electronic component 21 to have such a structure that its mounting surface is discernible. This may be done by providing the element body 22 with some marks or rendering the electronic component 21 an asymmetrical form and so forth for discerning.

The electronic component 21 is mounted on the board surface and joined to a circuit on the board through solder. Hence, disposing the metal layers 27 on the same plane of a set of terminal electrodes 25 formed on one surface of the electronic component 21 for joining with the mounting surface of the board causes the electronic component 21 to have a smaller mounting area and higher mounting density on the mounting board surface.

Though not restricted in particular, preferred typical examples of materials for the terminal electrodes 25 at this time include Ag, Cu, Ni, and those constituted by their alloys. Among them, preferably used are Cu and Ni, with which the inner electrode layers 23 can be constructed by base metals, and materials containing their alloys. In particular, they are preferably constituted by Cu or Ni from the viewpoint of connectivity and in that the oxide film 26 can be provided by oxidizing the surface of the terminal electrode 25.

Preferably, the oxide film 26 is formed by forced oxidation. Preferably, the oxide film 26 exhibits an oxide peak discriminable by X-ray diffractometry or the like and is insulative, and thus has a thickness of 10 nm or greater. The thickness is preferably 1 µm or less in order to keep the electric joint with the inner electrode layers 23.

Though metals contained in the oxide film 26 are not restricted in particular, the oxide film 26 preferably contains at least one metal selected from Cu, Pe, Zn, Al, and Ni or any of their alloys, for example. This can suppress a reaction by which the oxide film 26 is reduced to become a metal film at the time of forming the metal layer 27, thereby inhibiting short circuits from occurring when the electronic component 21 comes into contact with other electronic components on the mounting board. From the viewpoint of electrical junction with the inner electrode layers 23, metals containing Cu and Ni or alloys thereof are more preferred.

Preferably, the oxide film 26 is mainly composed of an element different from a main component of the metal layer 27. In particular, this can effectively inhibit solder from wetting and spreading over the surface of the side face part 25b of the terminal electrode 25 when the metal contained in the oxide film 26 has a solder wetting and spreading rate lower than that of the metal serving as a main component of the metal layer 27. By the main component is meant herein an element having the highest ratio.

Though not restricted in particular, the metal layer 27 preferably contains at least one metal selected from Cu, Sn, and Au or ally of their alloys, for example. This makes the joint with the pads of the board more favorable at the time of mounting.

Preferably, the metal layer 27 contains Sn or a Sn alloy as a main component. More preferably, the main component of elements of the metal layer 27 is Sn. Preferably, the Sn or Sn alloy layer is formed by plating or molten soldering. Its thickness, which may be determined as appropriate according to its use and the like, is preferably on the order of 0.5 to 10 µm in general. By the main component is meant herein an element having the highest ratio.

An alloy phase is formed between metals contained in the terminal electrode 25 and solder, whereby the solder wets the surface of the terminal electrode 25 and goes up the surface of the side face part 25b of the terminal electrode 25. Depending on the type of metal contained in the terminal electrode 25, however, the temperature and reaction speed at which it forms the alloy phase with the solder may vary. They vary greatly in particular between Sn and any of other types of metals, whereby the speed at which the solder goes up the surface of the side face part 25b of the terminal electrode 25 is much slower when the terminal electrode 25 does not contain Sn as a component for the side face part 25b than when does.

When an oxide of any of the other metals exists on the surface of the side face part 25b of the terminal electrode 25, solder is hard to go up the surface of the side face part 25b of the terminal electrode 25, whereby the electronic component 21 comprising the terminal electrode 25 with a small mounting area can be obtained.

When the oxide contains Sn, on the other hand, the speed at which it forms an alloy with solder is lower than that at which an alloy is formed between solder and metallic Sn or a Sn alloy, but the solder goes up the surface of the side face part 25b of the terminal electrode 25, thereby making it harder to obtain the electronic component 21 comprising a terminal electrode with a smaller mounting area.

A method of manufacturing the electronic component 21 of Embodiment 1 comprises:

(i) a first step of forming, cutting, and firing a green multilayer body having a plurality of ceramic green sheets (ceramic layers 24) and electrode layers (inner electrode layers 23) buried between adjacent ceramic green sheets, so as to form the element body 22;

(ii) a second step of forming the first terminal electrode 25 on the mounting surface 22a and one side face 22b of a plurality of side faces 22b, 22c and the second terminal electrode 25 on the mounting surface 22a and another side face 22b of the plurality of side faces 22b, 22c, so as to make the terminal electrodes 25;

(iii) a third step of disposing the oxide films 26 at least on the surfaces of the side face parts 25b of the first and second terminal electrodes 25, which are parts formed on the side faces 22b, 22c, excluding the mounting parts 25a of the first and second terminal electrodes 25, which are parts formed on the mounting surface 22a; and (iv) a fourth step of forming the metal layers 27 on the surfaces of the mounting parts 25a of the first and second terminal electrodes 25. These steps will be explained in detail in the following.

The first step is a step for preparing the element body 22. Though not restricted in particular, barium titanate may be used as a main component in the element body 22, for example.

Next, the ceramic green sheets formed with desirable various electrode patterns are stacked in a predetermined order. Ceramic green sheets formed with no electrode patterns may be inserted in the stack as appropriate. Thus, the green multilayer body having a plurality of ceramic green sheets and electrode layers buried between adjacent ceramic green sheets can be obtained.

The green multilayer body is cut into a predetermined size, thus obtained green chip is debindered, fired, and annealed, and then surfaces where end parts of the inner electrode layers 23 are exposed (the side faces 22b, which will also be referred to as end faces of the element body 22 in the following) are polished by barrel polishing, sandblasting, or the like, whereby the element body 22 is obtained.

The second step is a step for forming a pair of terminal electrodes 25 on the end faces of the element body 22. The terminal electrodes 25 may be formed by baking applied electrodes or electrolytic or electroless plating, though the method of forming them is not restricted in particular. For example, terminal electrodes made of Cu may be formed as the terminal electrodes 25 on the end faces of the element body 22.

When forming them by baking applied electrodes, for example, a paste for outer electrodes is printed or applied and then fired, so as to form the terminal electrodes 25. The outer electrodes are fired, for example, for about 10 min to 1 hr at a temperature of 600 to 800° C. in a humidified mixed gas of $N_2$ and $H_2$.

Figure 4:
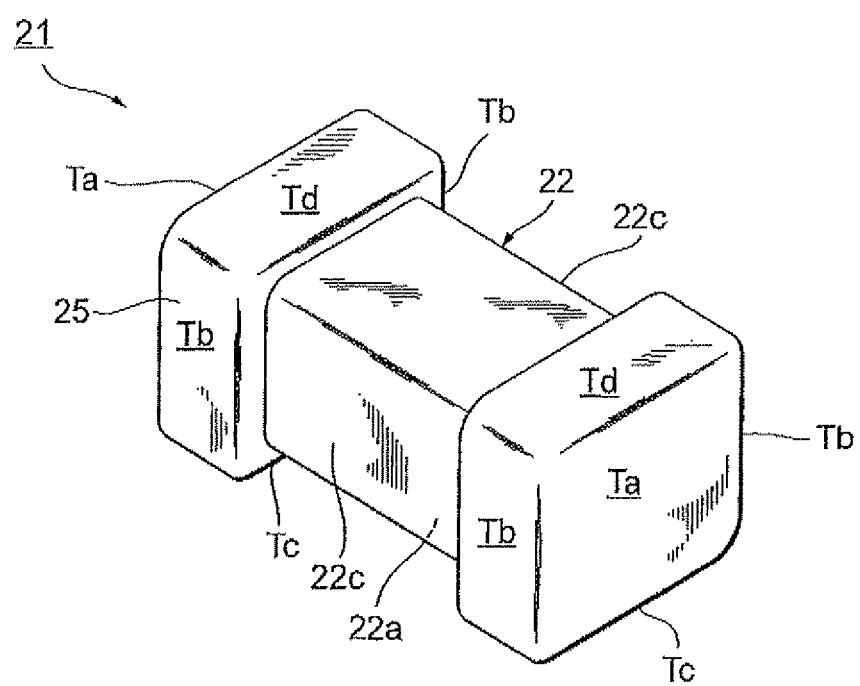
FIG. 4 is a perspective view of the electronic component of Embodiment 1.

The third step is a step of providing the surfaces of the terminal electrodes 25 with the oxide films 26, i.e., a step of partly covering the terminal electrodes 25 with the oxide films 26. FIG. 4 is a perspective view of the electronic component 21 of Embodiment 1. Referring to the surfaces of the side face parts 25b (opposing each other in the longitudinal direction) of the terminal electrodes 25 parallel to the side faces 22b of the element body 22 of the electronic component 21 as Ta, the surfaces (opposing each other in the lateral direction) excluding the surfaces Ta of the side face parts 25b in the surfaces abutting the surfaces of the mounting parts 25a as Tb, the surfaces to be mounted on the board as Tc, and the surfaces on the opposite side of the surfaces Tc as Td, the surfaces to be provided with the metal layers 27 and oxide films 26 will be explained with reference to FIG. 4.

It is sufficient for the metal layers 27 to exist on one identical surface of the electronic component 21 and for at least the surfaces Ta of the terminal electrodes 25 to be covered with the oxide films 26. This longitudinally reduces the mounting area of the electronic component 21, thereby enabling high-density mounting. Preferably, the surfaces Ta, Tb of the terminal electrodes 25 are covered with the oxide films 26. This can further inhibit solder from rising when mounting the electronic component 21 laterally, thereby laterally reducing the mounting area of the electronic component 21. In Embodiment 1, as illustrated in FIG. 3, only the surfaces Tc are provided with the metal layers 27, while the surfaces Ta, Tb, Td of the terminal electrodes 25 are covered with the oxide films 26.

The method of providing the surfaces of the terminal electrodes 25 with the oxide films 26 is not limited in the third step. For example, sputtering with oxide targets and direct coating with paste and the like containing oxides may be used.

A method of oxidizing the surfaces of the terminal electrodes 25 may also be used. The method of oxidization is not limited in particular and may be performed by heating in the air or an atmosphere with a high oxygen concentration or chemically processing the surfaces. For example, heat treatment in the air for 2 to 7 hr at a temperature of 200° C. or higher can form the oxide films 26.

The fourth step is a step of forming the metal layers 27 on the terminal electrodes 25. Here, the metal layers 27 are preferably Sn or Sn alloy layers from the viewpoint of connectivity with solder. The Sn or Sn alloy layers may be formed by plating or molten soldering.

The order of performing the third and fourth steps is not restricted in particular, so that they may be done in the reverse order. In the latter case, the fourth step forms the metal layers 27, and then, while masking the metal layers 27, the third step is performed, so as to provide the surfaces of the terminal electrodes 25 with the oxide films 26.

Figure 5:
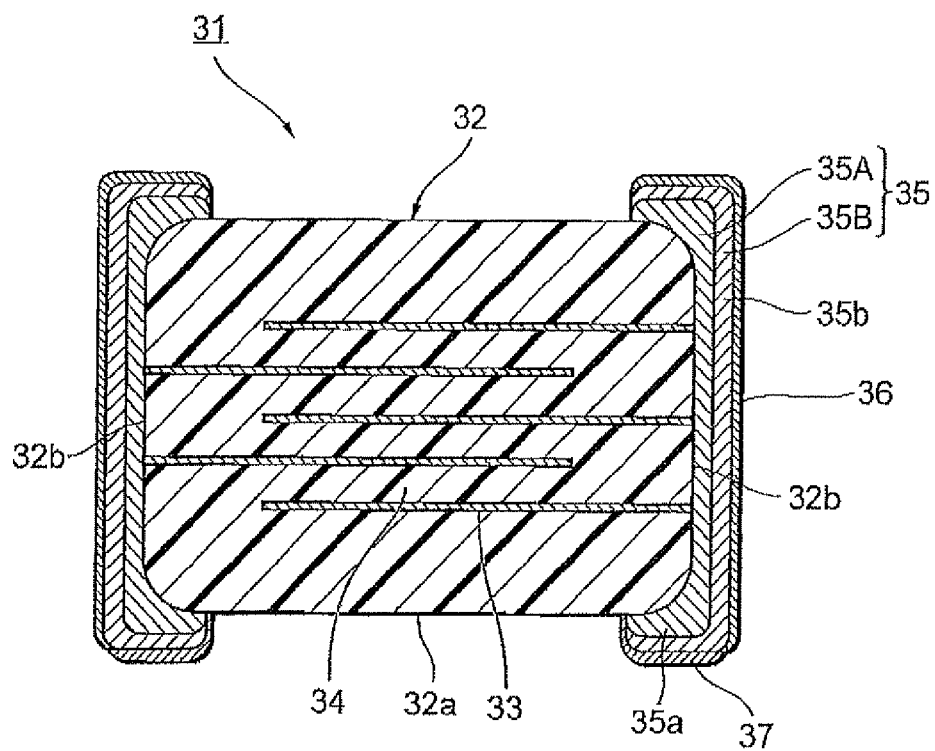
FIG. 5 is a sectional view schematically illustrating an electronic component of Embodiment 2.

The electronic component in accordance with. Embodiment 2 of the present invention will now be explained. FIG. 5 is a schematic view of a cross section of this electronic component 31. A terminal electrode 35 of the electronic component 31 differs from the terminal electrode 25 of Embodiment 1 in that it is constituted by two layers 35A, 35B. That is, the terminal electrode 35 of Embodiment 2 comprises a foundation electrode layer 35A which is similar to the terminal electrode 25 of Embodiment 1 and formed on a mounting surface 32a and side face 32b of an element body 32, and a surface layer 35B formed on a surface of the foundation electrode layer 35A, while an oxide film 36 and a metal layer 37 are formed on a surface of the terminal electrode 35. As illustrated in FIG. 5, surfaces of side face parts 35b of the terminal electrodes 35 in the electronic component 31 are covered with oxide films 36. More specifically, only the surfaces of the mounting parts 35a of the terminal electrodes 35 in the electronic component 31 are covered with the metal layers 37, while the remainder is covered with the oxide films 36. Here, though not restricted in particular, the surface layers 35B may be mainly composed of elements such as Cu and Ni. From the viewpoint of partly oxidizing the surface layers 35B, so as to produce the oxide films 36, Cu and Ni are used preferably.

For providing the surfaces of the terminal electrodes 35 with the oxide films 36, producing the oxide films 36 by oxidizing the surface layers 35B mainly composed of elements different from the main component of the foundation electrode layers 35A of the terminal electrodes 35 as in Embodiment 2 is more preferred in that it can stably secure the conduction of the terminal electrodes 35.

Though the method of forming the surface layers 35B at this time is not restricted in particular, a fifth step is provided as (v) a step of forming the surface layers 35B after the second step (ii). For example, sputtering, vapor deposition, or plating may be used as the fifth step at this time.

From the viewpoint of inhibiting the foundation electrode layers 35A of the terminal electrodes 35 from dissolving into solder when mounting the electronic component 31 onto a board with the solder in the case where the foundation electrode layers 35A of the terminal electrodes 35 are constituted by a composition containing Cu, the surface layers 35B at this time are more preferably provided as layers of a composition containing Ni or a Ni alloy. The Ni or Ni alloy layers are preferably formed by plating or vapor deposition. Their thickness, which may be determined as appropriate according to their uses and the like, is preferably on the order of 0.5 to 10 µm in general.

Figure 6:
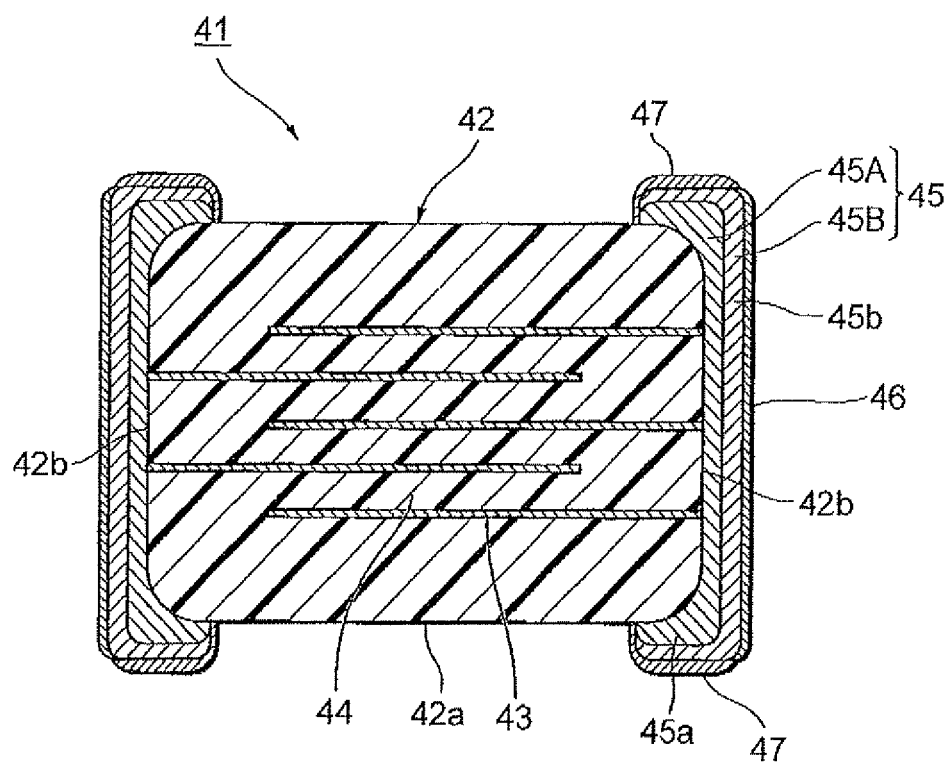
FIG. 6 is a sectional view schematically illustrating an electronic component of Embodiment 3.

The electronic component in accordance with Embodiment 3 of the present invention will now be explained. FIG. 6 is a schematic view of a cross section of this electronic component 41. It is the same as the electronic component 31 of Embodiment 2 except for positions where metal layers 47 are disposed as metal layers. That is, a terminal electrode 45 of the electronic component 41 comprises a foundation electrode layer 45A which is similar to the terminal electrode 25 of Embodiment 1 and formed on a mounting surface 42a and side faces 42b of an element body 42 and a surface layer 45B formed on a surface of the foundation electrode layer 45A, while an oxide film 46 and the metal layer 47 are formed on a surface of the terminal electrode 45.

The metal layers 47 are disposed on only the surfaces Tc and Td, which are surfaces to be mounted on a board, while the other surfaces Ta, Tb of the terminal electrodes 45 are covered with the oxide films 46. This can choose two mounting surfaces onto the board, thereby lowering the process load at the time of mounting.

Thus manufactured electronic components in accordance with Embodiments 1 to 3 of the present invention can be mounted onto printed boards and the like with solder and the like, so as to be used for various electronic instruments and the like.

EXAMPLES

The embodiments of the present invention will now be explained in detail according to examples with reference to the drawings.

Examples 1 and 2

First, an element body in the form of 0402M was prepared, and its end faces were coated with a Cu paste for external electrodes, which was then fired, so as to form a pair of terminal electrodes. The external electrodes were fired for 10 min at a temperature of 700° C. in a humidified mixed gas of $N_2$ and $H_2$.

This obtained element body was masked such as to cover all the surfaces of the mounting parts of the pair of terminal electrodes and put into a hot-air dryer, so as to be heat-treated in the air, whereby the surfaces of the terminal electrodes excluding the masked surfaces were oxidized, thus forming the oxide films.

Thus obtained element body was washed with alcohol and dipped for 10 min in a thiourea-doped Sn plating solution (at a bath temperature of 70° C.) so as to form a Sn electroless plating film having a thickness of 1 μm as a metal layer on the surfaces of the terminal electrodes excluding the oxide films, thereby yielding a sample of Example 1. Thus obtained was the sample of Example 1 in which, as in Embodiment 1, only the surfaces of the terminal electrodes of the electronic component were covered with metal layers, while the surfaces of the terminal electrodes excluding the parts covered with the metal layers were clad with oxide films.

The sample was evaluated by using techniques which will be explained later.

Evaluation of Adherence of Metal Layers

For evaluating the metal layers of the surfaces of the terminal electrodes in thus obtained electronic component, the surfaces of the terminal electrodes of the electronic component formed with the metal layers were observed with a stereoscopic microscope, and those covered with the metal layers by an area ratio of 95% or more were evaluated "A" as having sufficiently favorable solder wettability. Those covered with the metal layers by an area ratio of less than 95% were evaluated "B" as insufficient in terms of solder wettability.

Evaluation of Solder Rising to Side Face Parts of Terminal Electrodes

Figure 7:
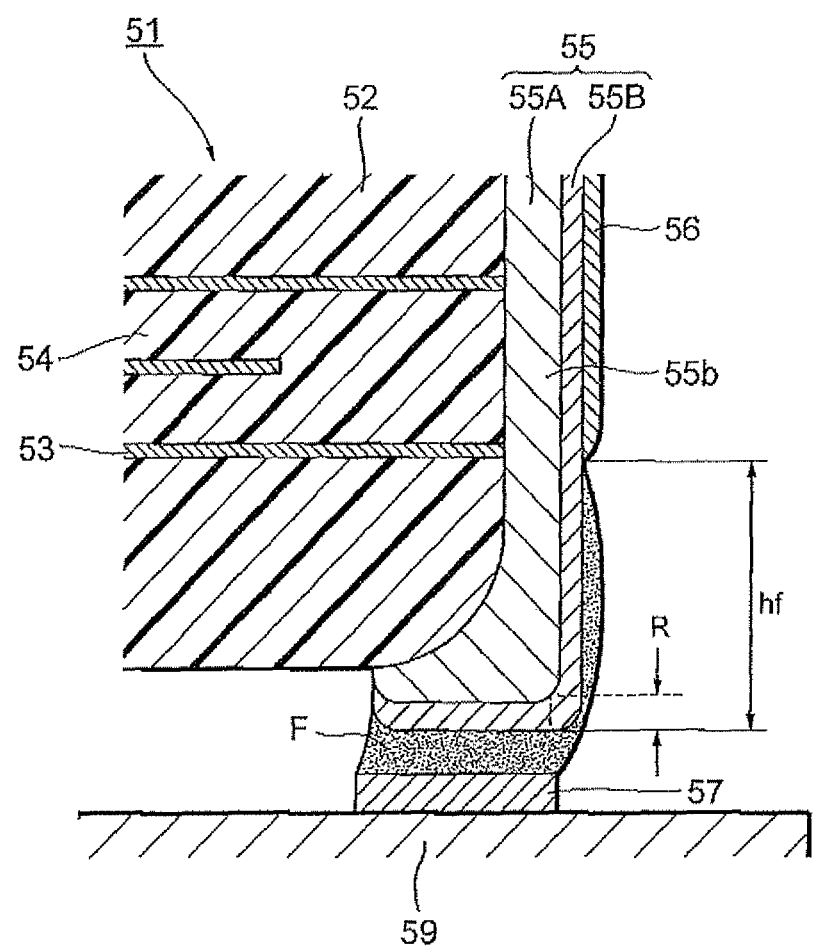
FIG. 7 is an explanatory view for evaluating solder rising to an end face.

For explaining the evaluation of solder rising to the side face parts of the terminal electrodes, FIG. 7 which is a schematic view observing a cross section of a junction between an electronic component and a board will be used.

A solder rise evaluation board 59 formed with a pad 57 for mounting an electronic component having a form of 0.4 mm×0.2 min (0402M) was prepared. A solder paste was printed on the pad 57 of the solder rise evaluation board 59. Using a mounter, each of electronic components 51 of 0402M produced by examples and comparative examples was placed on the solder rise evaluation board 59. The solder rise evaluation board 59 mounted with the electronic component 51 was heated in a reflow furnace, so as to join a terminal electrode 55, which was constituted by a foundation electrode layer 55A of the electronic component 51 and a surface layer 55B, to the pad 57 of the board, thereby yielding a solder rise evaluation sample. Using thus obtained solder rise evaluation sample, the solder rise was evaluated.

Molten solder having higher wettability with respect to the terminal electrode 55 is easier to go up the surface of a side face part 55b of the electronic component 51. Therefore, as a solder joint F has a greater solder rise height hf, solder spreads by a larger area on the board, thereby increasing the mounting area on the board.

The rise of molten solder was evaluated by the height (solder rise height) hf of the solder joint F when joining the terminal electrode 55 of the electronic component 51 to the pad 57 of the solder evaluation board 59 with the solder. The solder rise height hf is the distance from the surface of the terminal electrode 55 of the electronic component 51 opposing the solder rise evaluation board 59 to the boundary (solder rise end part) of the surface of the side face part 55b of the terminal electrode 55 (the surface perpendicular to the solder rise evaluation substrate 59) with the solder joint F.

In the solder rise evaluation, those having the solder rise height hf smaller than the radius of curvature R of the terminal electrode 55 of the electronic component 51 was evaluated "A" as favorable. Those having the solder rise height hf greater than the radius of curvature R of the terminal electrode 55 were evaluated "13" as poor. Those which could not be mounted were labeled "C" as unevaluable. The solder rise height hf was measured by observing a cross section of the surface Ta of the terminal electrode in the longitudinal direction of the electronic component 51 (direction of the terminal electrode 55 of the electronic component 51).

As the solder used here, commercially available solder may be employed, while the heating condition in the reflow furnace may be adjusted according to the solder. Here, using lead-free solder having a composition of 96.5 wt % of Sn, 3 wt. % of Ag, and 0.5 wt % of Cu (manufactured under the product name of M705 by Senju Metal Industry Co., Ltd.), heating in the reflow furnace was performed under such a condition that a temperature of 240° C. or higher was kept for 30 s with a top temperature of 260° C.

Mounting Area Evaluation

For evaluating the mounting area of thus obtained electronic component, those yielding a mounting area not greater than the area of 0.4×02 mm of the electronic component when mounted on the board were evaluated "A," those yielding a mounting area greater than the area 0.4×0.2 mm$^2$ were evaluated "B" as poor, and those which could not be mounted were labeled "C" as unevaluable.

Determination

Samples exhibiting "A" in all the evaluations of the metal layer adherence, solder rise to the longitudinal surface Ta of the terminal electrode, and mounting area were evaluated "A" as favorable. Samples exhibiting "B" only in the mounting area evaluation due to the solder rise in the lateral surface Tb were evaluated "B." Samples exhibiting "B" or "C" in each of the evaluations of the solder rise to the longitudinal surface Ta of the terminal electrode and mounting area were evaluated "C" as poor.

Next, in an element body obtained by forming a Ni coating layer as a surface layer by electrolytic plating, surfaces of a pair of terminal electrodes excluding surfaces of mounting parts of the terminal electrodes were oxidized, so as to form oxide films. Thereafter, a Sn electroless plating film having a thickness of 1 μm was formed as a metal layer on the Ni skin layer on the surface layer other than the oxide films, go as to yield a sample of Example 2. That is, a sample similar to Embodiment 2 was obtained.

Table 1 illustrates evaluation results of the samples of Examples 1 and 2. Table 1 indicates the positions of metal layers and oxide films on the terminal electrode surfaces of the electronic components in the same positional explanations as with the surface positions illustrated in the perspective view of the electronic component of Embodiment 1. Further, in the surfaces of the terminal electrodes, those provided with the oxide films and metal layers are labeled as Oxide and Metal, respectively.

TABLE 1

| Condition | Surface layer element | Oxide film element | Surface formed with oxide film in terminal electrode | | | | Metal layer adherence | Solder rise to surface Ta | Mounting area | Determination |
|---|---|---|---|---|---|---|---|---|---|---|
| | | | Surface Ta | Surface Tb | Surface Tc | Surface Td | | | | |
| Example 1 | no surface layer | Cu | Oxide | Oxide | Metal | Oxide | A | A | A | A |
| Example 2 | Ni | Ni | Oxide | Oxide | Metal | Oxide | A | A | A | A |

The following results could be seen from Table 1. In these examples, the samples were evaluated with regard to whether or not the terminal electrodes of the electronic components had the surface layers. Each of the samples represented as Examples 1 and 2 was seen to have oxidized the surfaces Ta, Tb of the terminal electrodes and caused no solder to go up the surfaces Ta, Tb, thereby yielding favorable structures with small mounting areas as the terminal electrodes.

Examples 2 to 4 and Comparative Examples 1 to 3

Samples of Examples 3 and 4 and Comparative Examples 1 to 3 were made as with Example 2 except that surfaces to be provided with oxide films in the terminal electrode electrodes were changed from Example 2 as illustrated in Table 2. Results are also listed in Table 2. The sample of Example 3 was the same as the electronic component 31 of Example 2 (Embodiment 2) except for the positions where the metal layers 37 were disposed. That is, a sample similar to Embodiment 3 was obtained.

TABLE 2

| Condition | Oxide film element | Surface formed with oxide film in terminal electrode | | | | Evaluation item | | | |
|---|---|---|---|---|---|---|---|---|---|
| | | Surface Ta | Surface Tb | Surface Tc | Surface Td | Metal layer adherence | Solder rise to surface Ta | Mounting area | Determination |
| Example 2 | Ni | Oxide | Oxide | Metal | Oxide | A | A | A | A |
| Example 3 | Ni | Oxide | Oxide | Metal | Metal | A | A | A | A |
| Comparative Example 1 | Ni | Metal | Oxide | Metal | Metal | A | B | B | C |
| Example 4 | Ni | Oxide | Metal | Metal | Metal | A | A | B | B |
| Comparative Example 2 | Ni | Metal | Metal | Oxide | Metal | B | B | B | C |
| Comparative Example 3 | Ni | Metal | Metal | Metal | Metal | A | B | B | C |

The following results could be seen from Table 2. In these examples, the samples were evaluated with regard to differences in oxidized surfaces of terminal electrodes in the electronic components. The samples represented as Examples 2 and 3 were seen to have oxidized the surfaces Ta, Tb of the terminal electrodes and caused no solder to go up the surfaces Ta, Tb, thereby yielding favorable structures with small mounting areas as the terminal electrodes.

The sample represented as Example 4 oxidized the surfaces Ta of the terminal electrodes and thus did not cause solder to go up the surfaces Ta but Tb. Therefore, its mounting area became greater than 0.4×0.2 mm², but it was a structure having a mounting area smaller than that of a conventional electronic component causing solder to go up both of the surfaces Ta, Tb and thus was determined "B,"

On the other hand, the samples represented as Comparative Examples 1 and 2 failed to oxidize the surfaces Ta of the terminal electrodes and thus caused solder to go up the surfaces Ta. The sample represented as Comparative Example 3 was a conventional electronic component which did not oxidize any surface of the terminal electrodes and thus formed Sn layers on the surfaces of mounting parts but failed to inhibit solder from going up the surfaces Ta, Tb, thereby being a structure having a large mounting area.

Example 5 and Comparative Example 4

Samples of Example 5 and Comparative Example 4 were made as with Example 2 except that the kinds of metals contained in the oxide films of the terminal electrodes were changed from Example 2. Table 3 illustrates the results.

On the other hand, the sample represented as Comparative Example 4 covered the surfaces Ta, Tb with oxide films as with Examples 2 and 5. However, solder wets the oxidized Sn film though more slowly than the metallic Sn film and thus goes up the surfaces Ta, Tb. Hence, the terminal electrodes with small mounting areas could not be obtained.

Comparative Examples 5 and 6

Samples of Comparative Examples 5 and 6 were made as with Example 2 except that the kinds of metals contained in the oxide films of the terminal electrodes were changed and that the terminal electrodes were oxidized in order to provide all the surfaces of the terminal electrodes with the oxide films. No Sn layer was formed in the sample of Comparative Example 6, since its surface layer contained Sn. Table 4 illustrates the results.

TABLE 4

| | | Surface formed with oxide film in terminal electrode | | | | Evaluation item | | | |
|---|---|---|---|---|---|---|---|---|---|
| Condition | Metal film element | Surface Ta | Surface Tb | Surface Tc | Surface Td | Sn layer adherence | Solder rise to surface Ta | Mounting area | Determination |
| Comparative Example 5 | Ni | Oxide | Oxide | Oxide | Oxide | B | C | C | C |
| Comparative Example 6 | Sn | Oxide | Oxide | Oxide | Oxide | — | B | B | C |

The following results could be seen from Table 4. Evaluated in these examples were samples in which, while changing the kinds of metals contained in the oxidized films of the terminal electrodes of the electronic components, all the surfaces of the terminal electrodes were oxidized. The sample represented as Comparative Example 5 formed no Sn layer on the surfaces of the mounting parts and thus could not be mounted on the board. On the other hand, the sample represented as Comparative Example 6 covered the surfaces of the mounting parts with SnO₂ layers, which were wettable with solder, and thus could be mounted, but caused the solder to go up the surfaces Ta, Tb. Therefore, none of the samples could yield a small mounting area.

TABLE 3

| | | Surface formed with oxide film in terminal electrode | | | | Evaluation item | | | |
|---|---|---|---|---|---|---|---|---|---|
| Condition | Oxide film element | Surface Ta | Surface Tb | Surface Tc | Surface Td | Sn layer adherence | Solder rise to surface Ta | Mounting area | Determination |
| Example 2 | Ni | Oxide | Oxide | Metal | Oxide | A | A | A | A |
| Example 5 | Cu | Oxide | Oxide | Metal | Oxide | A | A | A | A |
| Comparative Example 4 | Sn | Oxide | Oxide | Metal | Oxide | A | B | B | C |

The following results could be seen from Table 3. In these examples, the samples were evaluated with regard to differences in kinds of metals contained in the oxide films of the terminal electrodes of the electronic components. Examples 2 and 5 oxidized the surfaces Ta, Tb of the terminal electrodes and caused no solder to go up the surfaces Ta, Tb, thereby yielding favorable structures with small mounting areas as the terminal electrodes.

Example 6

The sample of Example 6 was made as with Example 2 except that the terminal electrodes were oxidized all over the surfaces and then the oxide films were polished away from only the surfaces of the mounting parts. Table 5 illustrates the results.

TABLE 5

| Condition | Metal film element | Surface formed with oxide film in terminal electrode | | | | Evaluation item | | | Determination |
| --- | --- | --- | --- | --- | --- | --- | --- | --- | --- |
| | | Surface Ta | Surface Tb | Surface Tc | Surface Td | Sn layer adherence | Solder rise to surface Ta | Mounting area | |
| Example 5 | Ni | Oxide | Oxide | Metal ✗ polishing | Oxide | A | A | A | A |

The following results could be seen from Table 5. Example 6 evaluated a sample in which the electronic component was oxidized all over the surfaces and then the oxide films on the surfaces of the mounting parts were removed with sandpaper. The sample represented in this example was favorable in each of the evaluation results and yielded favorable structures with small mounting areas as the terminal electrodes.

Example 7

The sample of Example 7 was made as with Example 2 except that oxide films were formed on surfaces other than those of the mounting parts by using a NiO target without oxidizing any of the surfaces of the terminal electrodes, Table 6 illustrates the results.

TABLE 6

| Condition | Metal film element | Surface formed with oxide film in terminal electrode | | | | Evaluation item | | | Determination |
| --- | --- | --- | --- | --- | --- | --- | --- | --- | --- |
| | | Surface Ta | Surface Tb | Surface Tc | Surface Td | Sn layer adherence | Solder rise to surface Ta | Mounting area | |
| Example 7 | Ni | sputtering | sputtering | Metal | sputtering | A | A | A | A |

The following results could be seen from Table 6. This example evaluated a sample in which oxide films were formed on surfaces other than those of the mounting parts by using the NiO target without oxidizing the terminal electrodes of the electronic component. The sample represented in Example 7 was favorable in each of the evaluation results and yielded favorable structures with small mounting areas as the terminal electrodes.

The electronic components obtained by Examples 1 to 7 could be mounted with narrower longitudinal intervals without troubles such as short circuits therebetween, whereby their mounting areas could be made smaller.

Without being restricted at all to the embodiments explained in the foregoing, the present invention can be modified in various ways within the scope not deviating from the gist of the invention.

For example, though the above-mentioned embodiments illustrate multilayer ceramic capacitors as an example of the electronic component in accordance with the present invention, its examples include capacitors, piezoelectric elements, inductors, varistors, thermistors, resistors, transistors, diodes, crystal oscillators, their composite elements, and other surface-mounting electronic components.

INDUSTRIAL APPLICABILITY

The present invention can reduce the mounting area of an electronic component and thus can be utilized for mounting the electronic component to boards of electronic circuit modules and the like which axe required to have higher density.

What is claimed is:

1. An electronic component comprising an element body having a mounting surface and a plurality of side faces, the electronic component further comprising:
    a first terminal electrode formed on the mounting surface and one of the plurality of side faces;
    a second terminal electrode formed on the mounting surface and another side face in the plurality of side faces;
    a metal film formed on and in direct contact with a surface of a mounting part of each of the first and second terminal electrodes formed on the mounting surface; and
    an oxide film covering and in direct contact with at least a part of a surface of a side face part of each of the first and second terminal electrodes formed on the side faces.

2. An electronic component according to claim 1, wherein the oxide film is mainly composed of an element different from a main component of the metal film.

3. An electronic component according to claim 1, wherein the metal film contains Sn or a Sn alloy as a main component.

* * * * *